United States Patent [19]

Kudo et al.

[11] 4,292,153
[45] Sep. 29, 1981

[54] METHOD FOR PROCESSING SUBSTRATE MATERIALS BY MEANS OF PLASMA TREATMENT

[75] Inventors: Daijiro Kudo, Yokohama; Kiyoshi Ikeda, Kitakyusyu, both of Japan

[73] Assignee: Fujitsu Limited, Kawasaki, Japan

[21] Appl. No.: 130,537

[22] Filed: Mar. 14, 1980

[30] Foreign Application Priority Data

Mar. 19, 1979 [JP] Japan .................... 54-32019

[51] Int. Cl.³ ......................................... H01L 21/306
[52] U.S. Cl. ...................................... 204/164; 118/715;
156/345; 156/643; 156/646; 204/192 E;
204/298; 250/531; 427/38
[58] Field of Search ............ 204/164, 192 E, 192 EC,
204/298; 156/643, 646, 345; 118/620, 623, 625,
715; 427/38, 39, 47; 250/527–531

[56] References Cited

U.S. PATENT DOCUMENTS

| 3,450,617 | 6/1969 | Hellund | 204/164 |
| 3,875,068 | 4/1975 | Mitzel | 250/531 |
| 3,971,684 | 7/1976 | Muto | 156/643 |
| 3,984,301 | 10/1976 | Matsuzaki et al. | 204/192 |
| 4,178,877 | 12/1979 | Kudo | 118/728 |

*Primary Examiner*—Delbert E. Gantz
*Assistant Examiner*—William Leader
*Attorney, Agent, or Firm*—Staas & Halsey

[57] ABSTRACT

A method for processing substrate materials by uniform plasma treatment, including the steps of mounting substrate materials onto a series of electrode plates arranged in parallel, alternately connecting the electrode plates to a pair of bus lines, applying a high-frequency power between the bus lines for producing plasma between the electrode plates, changing the feed points of the high-frequency power on the pair of bus lines so that the plasma treatment is effected substantially uniformly in the different spaces between the several electrode plates.

20 Claims, 18 Drawing Figures

METHOD FOR PROCESSING SUBSTRATE MATERIALS BY MEANS OF PLASMA TREATMENT

BACKGROUND OF THE INVENTION

1. Field of the Invention

The present invention relates to a method for processing substrate materials by means of plasma treatment and more particularly to a method for processing semiconductor wafers by means of plasma treatment, such as by a chemical vapor deposition (CVD) or by an etching process.

2. Description of the Prior Art

In order to electrically separate each element or each portion on a semiconductor wafer, it is well known that, by plasma treatment with a CVD or an etching process, insulating films of, for example, silicon dioxide ($SiO_2$) or silicon nitride ($Si_3N_4$), are deposited onto or etched away from desired portions on the semiconductor wafer (cf: U.S. Pat. No. 4,178,877). A CVD or etching process of plasma treatment is effected in a reaction tube in which a number of electrode plates are arranged in parallel to each other and are perpendicular to the longitudinal direction of the reaction tube. A semiconductor wafer is mounted on one surface of each electrode plate. In operation, a reaction gas is introduced into the reaction tube. By applying a high-frequency voltage to the electrode plates, an electric field is created between adjacent electrode plates, resulting in the reaction gas being ionized to produce a plasma between the adjacent electrode plates. In the CVD process, the reaction gas consists of, for example, monosilane ($SiH_4$) and nitrous oxide ($N_2O$) or ammonia ($NH_3$). In the etching process, the reaction gas consists of, for example, carbon tetrachloride ($CCl_4$) or carbon tetrafluoride ($CF_4$). Therefore, in the CVD process, silicon dioxide ($SiO_2$) or silicon nitride ($Si_3N_4$) is produced and deposited on the wafers by means of the plasma to form an insulating film on each wafer. In the etching process, the insulating films of silicon dioxide or silicon nitride are etched away by means of the plasma and, particularly, by means of the radicals in the plasma.

Also, in the CVD process, polycrystalline silicon or metal oxide such as aluminum oxide ($Al_2O_3$) can be deposited on the surfaces of the wafers by means of, e.g., decomposition of monosilane ($SiH_4$).

In addition, in the etching process, silicon wafers constituting substrate materials can be etched away by means of carbon tetrafluoride ($CF_4$), or metal layers such as aluminum (Al) or molybdenum (Mo) can be etched away by means of carbon tetrachloride ($CCl_4$).

However, according to the above-mentioned prior art technology, because the feed point of the high-frequency voltage is fixed to one end of the series of electrode plates, a uniform distribution of the intensity of the electric field cannot be realized within the reaction tube. Therefore, the distribution of the thickness of the films obtained by the CVD process cannot be uniform with respect to the several electrode plates. Also, the depth of the plasma etching cannot be uniform with respect to the several electrode plates.

The present invention is intended to solve the above-mentioned problems in the prior art.

SUMMARY OF THE INVENTION

It is an object of the present invention to provide a method for processing substrate materials substantially uniformly by plasma treatment.

It is another object of the present invention to provide a method for producing substantially uniform distribution of plasma between adjacent electrode plates.

It is still another object of the present invention to provide a method for realizing substantially uniform distribution of the intensity of the electric field between adjacent electrode plates.

It is a further object of the present invention to provide a method for depositing films of substantially uniform thickness on a number of semiconductor wafers by the CVD process employing the plasma treatment.

It is a still further object of the present invention to provide a method for effecting plasma etching substantially uniformly with respect to a number of wafers, each of which is mounted on an electrode plate.

In accordance with the present invention, there is provided a method for processing substrate materials by plasma treatment, including the steps of mounting the substrate materials onto a series of electrode plates arranged in parallel to each other, connecting alternate electrode plates to alternate one of a pair of bus lines, and applying high-frequency power to the pair of bus lines for producing plasma between the electrode plates. This method comprises the step of changing the feed points of the high-frequency power on the pair of bus lines, so that the plasma treatment is effected substantially uniformly in the spaces between the electrode plates.

DESCRIPTION OF THE PREFERRED EMBODIMENTS

Before describing the preferred embodiments, the prior-art method for processing semiconductor wafers by means of plasma treatment treating plasma will first be explained with reference to FIGS. 1 through 9.

Figure 1:
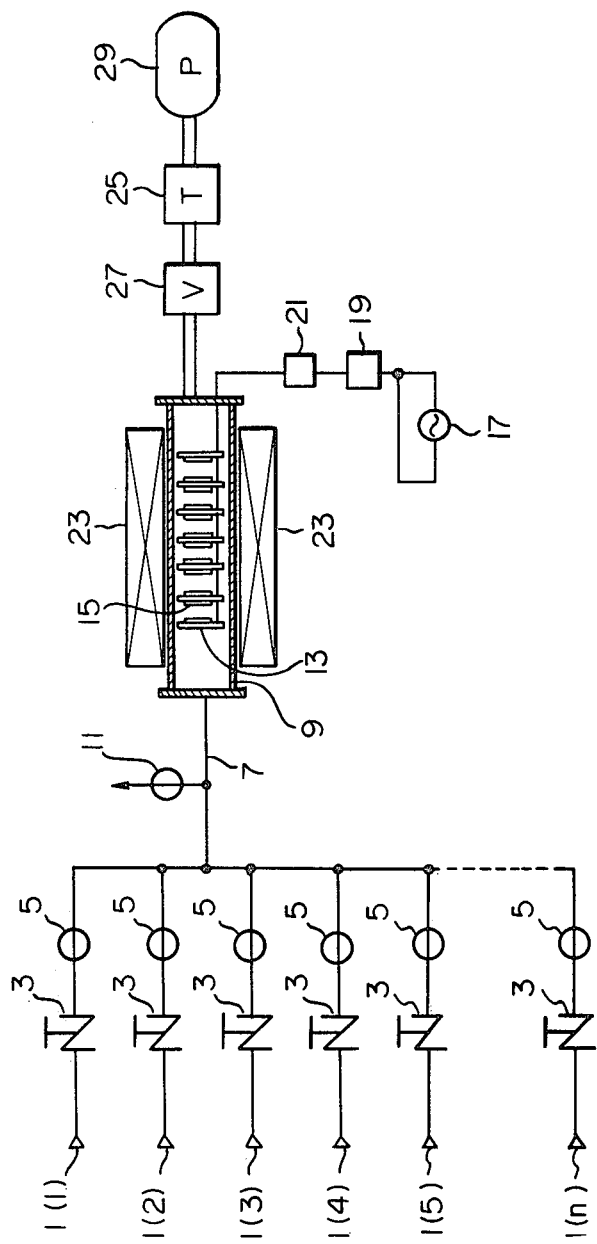
FIG. 1 is a schematic diagram illustrating a plasma treatment apparatus for explaining the fundamental method of the prior art.

FIG. 1 is a schematic diagram illustrating a plasma treatment apparatus for explaining the fundamental method of the prior art. Explaining briefly, a reaction gas of nitrous oxide ($N_2O$), nitrogen ($N_2$), monosilane ($SiH_4$), ammonia ($NH_3$), or carbon tetrafluoride ($CF_4$) is introduced from gas inlets 1(1), 1(2), 1(3), 1(4), or 1(5) respectively through a needle valve 3, a stop valve 5 and a duct 7 into a reaction tube 9 made of quartz. The amount of the introduced gas is controlled by each needle valve 3. In the quartz tube 9, a number of electrode plates 13 are arranged in parallel to each other, and are perpendicular to the longitudinal direction of the reaction tube 9. A semiconductor wafer 15 is mounted on a surface of each electrode plate 13. A high-frequency voltage is applied from a high-frequency oscillator (power supply) 17, through a power amplifier 19 and a control unit 21 including a power coupler (not shown), to the electrode plates 13 in the manner hereinafter described. At the same time, a heating furnace 23 is electrically powered to heat the quartz tube 9. Then, a plasma is produced within the quartz tube 9. For example, when monosilane ($SiH_4$) and ammonia ($NH_3$) have been introduced into the quartz tube 9 for the purpose of a CVD process, the produced plasma causes the chemical reaction represented as:

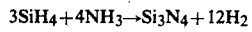

$$3SiH_4 + 4NH_3 \rightarrow Si_3N_4 + 12H_2$$

The silicon nitride ($Si_3N_4$) produced by this reaction is then deposited on the wafers 15. The hydrogen ($H_2$) and by-product gas produced by that reaction are introduced into a cooling trap 25 by opening a stop valve 27. The low boiling point gas is exhausted by an exhaust pump 29. The valve 11 is used for replacing the gas within the quartz tube 9 by a desired gas.

Figure 2:
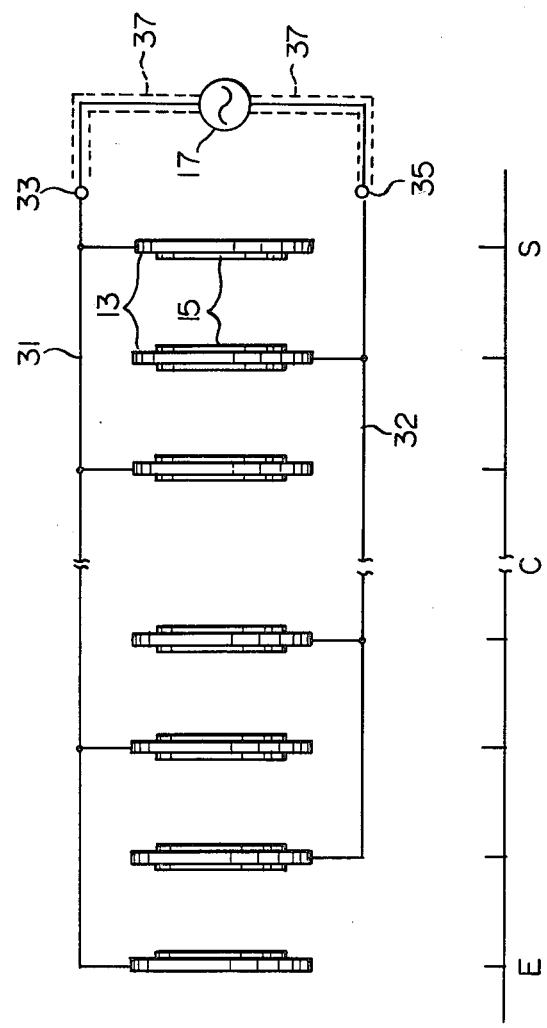
FIG. 2 is a schematic circuit diagram of the electrode portion of the prior-art apparatus of FIG. 1.

The method of applying the high-frequency voltage will now be described in conjunction with FIG. 2. FIG. 2 is a schematic diagram of the electrode portion within the quartz tube 9 of FIG. 1. As illustrated in FIG. 2, each of the electrode plates 13 is electrically connected to the high-frequency power supply 17 through either bus line 31 or 32, in such a manner that each of the adjacent electrode plates 13 is connected to the opposite terminal of the power supply 17. The portion between the end point 33 of the bus line 31 and the power supply 17, and the portion between the end point 35 of the bus line 32 and the power supply, are connected by coaxial cables 37. In order to avoid confusion, the power amplifier 19 and the control unit 21 (FIG. 1) are not shown in FIG. 2, but they are actually connected between the bus lines 31 and 32 and the power supply 17. It should be noted that, in this prior-art electrode structure, the feed points of the high-frequency power supply 17 to the bus lines 31 and 32 are fixed to the respective end points 33 and 35. The positions of the electrode plates with respect to the longitudinal direction of the quartz tube 9 are scaled below the schematic diagram of FIG. 2 with symbols S, C, and E, which respectively represent the start position, the center position, and the end position of the electrode plates with respect to the feeding terminals 33 and 35.

Figure 3:
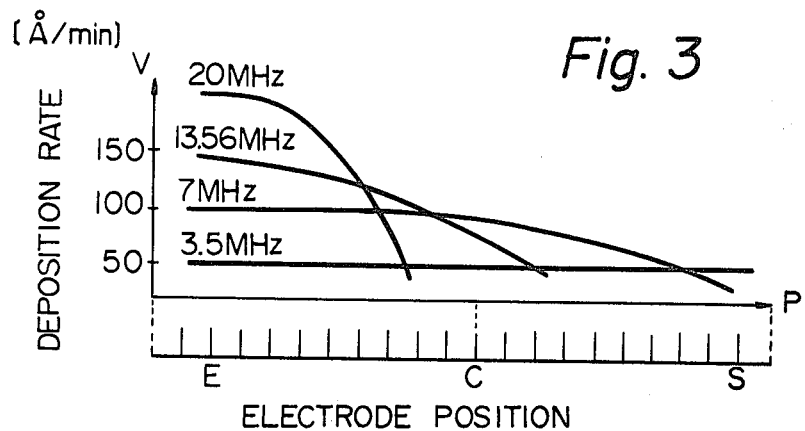
FIG. 3 is a graph illustrating deposition rates of films on the wafers with respect to the positions of the electrode plates for various frequencies applied to the electrode plates.

According to the method of feeding the power mentioned in conjunction with FIGS. 1 and 2, the deposition rates of films on the wafers or the etching rates of the wafers differ with respect to both the positions of the electrode plates and the frequency of the power applied to the electrode plates. FIG. 3 illustrates the deposition rates of the films on the wafers with respect to the positions of the electrode plates, for various frequencies applied to the electrode plates. As shown in FIG. 3, the higher the frequency of the applied power (3.5 MHz, 7 MHz, 13.56 MHz, 20 MHz), the more uneven the deposition rate becomes with respect to the positions of the electrode plates. FIG. 3 may also be adapted to explain the etching rates of the wafers by replacing the ordinate by "ETCHING RATE". The reason why the deposition rates or the etching rates are different will be described in conjunction with FIGS. 4 through 9.

Figure 4A:
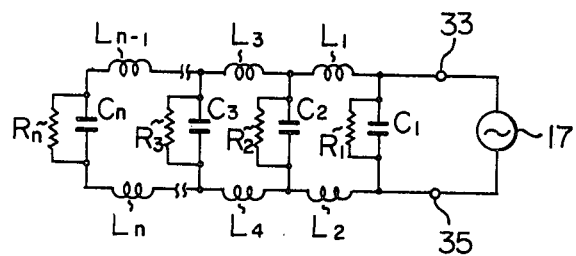
FIG. 4a is an equivalent circuit diagram of FIG. 2.

FIG. 4a is an equivalent circuit diagram of FIG. 2. In FIG. 4, each of the inductances $L_1, L_2, \ldots, L_{n-1}$ connected in series represents the bus line 31 between alternate electrode plates. Each of the inductances $L_2, L_4, \ldots, L_4$ connected in series represents the bus line 32 between alternate electrode plates. Each of the parallel circuits of $C_1$ and $R_1$, of $C_2$ and $R_2$, ..., and of $C_n$ and $R_n$ connected between the bus lines 31 and 32 represents a pair of adjacent electrode plates. Since the sum of the impedances $\omega L_1, \omega L_2, \ldots, \omega L_{n-1}$ is very small in comparison with the sum of the impedances $\omega C_1, \omega C_2, \ldots, \omega C_n$, the circuit of FIG. 4a can be drawn as an equivalent circuit as shown in FIG. 4b.

Figure 5A:
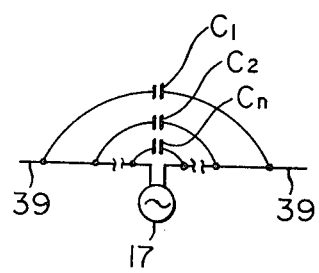
FIG. 5b is a simplified equivalent circuit diagram of FIG. 5a, FIG. 6 is an equivalent circuit diagram of both FIG. 4b and FIG. 5b.

Now, referring to FIGS. 5a and b, there are provided equivalent circuits of a well known dipole antenna. In FIG. 5a, the capacitors $C_1, C_2, \ldots, C_n$ represent distributed capacitances on a dipole antenna 39. The circuit of FIG. 5a can be drawn as an equivalent circuit as illustrated in FIG. 5b.

Figure 4B:
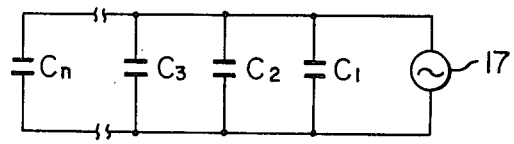
FIG. 4b is a simplified equivalent circuit diagram of FIG. 4a, FIG. 5a is an equivalent circuit diagram of a dipole antenna.
Figure 5B:
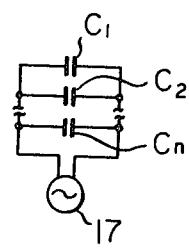
Figure 6:
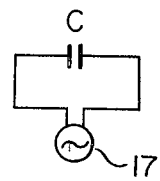

It will now be understood that the circuit of FIG. 4b, which is an equivalent circuit of the electrode structure of FIG. 2, and the circuit of FIG. 5b, which is an equivalent circuit of the dipole antenna of FIG. 5a, have substantially similar construction and can be drawn as equivalent circuits as illustrated in FIG. 6.

Figure 7:
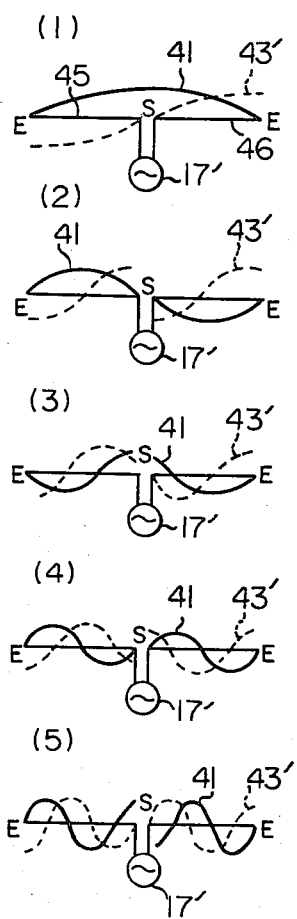
FIGS. 7(1) through 7(5) illustrate current distributions and voltage distributions on a dipole antenna for various frequencies, FIGS. 8(1) through 8(5) illustrate voltage distributions with respect to the position of the electrode structure of FIG. 2 for various frequencies, FIGS. 9(1) through 9(5) illustrate distributions of the intensity of the electric field in the reaction tube of the apparatus of FIG. 1, Each of FIGS. 10a through 10c presents two curves substantially showing the distribution of the electric field intensities when the feed points of the power to the bus lines are changed according to the present invention.

FIG. 7(1) illustrates a current distribution curve 41 and a voltage distribution curve 43' on a dipole antenna when a half wave length resonance is fed from a power supply 17' to the two elements 45 and 46 of the dipole antenna. FIGS. 7(2) through 7(5) also show these curves 41 and 43' on the dipole antenna when excited at λ, 3/2λ, 2λ, and 5/2λ respectively, where the notation λ represents one wave length of the power fed from the power supply 17'. In all the cases of FIGS. 7(1), 7(3), and 7(5), the current distributions show zero at both ends E of the antenna elements 45 and 46, and show maxima at the feed points S. Also, the voltage distributions show maxima at both ends E of the antenna elements and zero at the feed points S. The only difference among FIGS. 7(1) through 7(5) is that, when the wave length of the power fed to the antenna becomes short, accordingly the number of the standing waves of current or voltage is increased.

Figure 8:
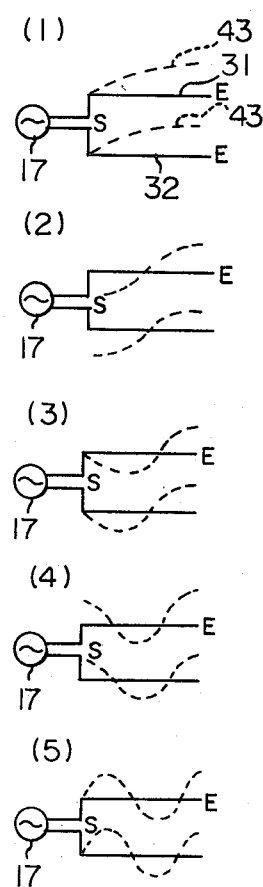

The above consideration with respect to the dipole antenna in conjunction with FIGS. 7(1) through 7(5) can be applied to the electrode structure of FIG. 2, because, as described before, the dipole antenna and the electrode structure of FIG. 2 have substantially the same equivalent circuit as shown in FIG. 6. Thus, voltage distribution curves on the bus lines 31 and 32 of the electrode structure of FIG. 2 are similar to those on the dipole antenna. The voltage distribution curves on the bus lines 31 and 32 are illustrated in FIGS. 8(1) through 8(5), which respectively show the cases when the bus lines 31 and 32 are driven at $\frac{1}{2}\lambda$, $\lambda$, $3/2\lambda$, $2\lambda$ and $5/2\lambda$. As will be understood from FIGS. 8(1), 8(3) and 8(5), voltage is zero at the feed point S of the power from the power supply 17 and maximum at the end points E, as in the case of the dipole antenna.

Figure 9:
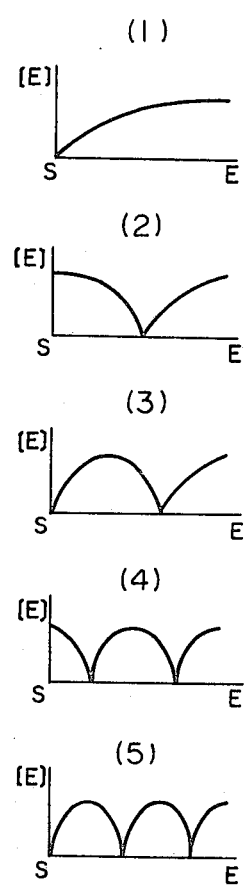

FIG. 9(1) is a graph of a distribution of the intensity of the electric field in the reaction tube 9 of FIG. 1. In FIG. 9(1), the abscissa represents the position of the electrode plates in the longitudinal direction of the reaction tube 9 from the feed point S to the end point E, and the ordinate represents the absolute value of the intensity of the electric field in the reaction tube 9. This graph can easily be obtained from the voltage distribution of FIG. 8(1). In FIG. 8(1), since the polarities of the voltages on the bus lines 31 and 32 are opposite to each other, the potential difference between the bus lines 31 and 32 is maximum at the end point E of the reaction tube 9. Thus, the absolute value of the electric field intensity is maximum at the end point E of the reaction tube. The electric field intensity at the feed point S is zero because, at that point S, the voltage is zero. FIGS. 9(2) through 9(5) also show graphs of electric field intensities in the reaction tube, and correspond to FIGS. 8(2) through 8(5), respectively. In all of FIGS. 9(1) through 9(5), it should be noted that according to the prior-art method, the electric-field intensity varies with respect to the position in the reaction tube. It is well known that the thickness of a film formed by a plasma CVD process is nearly proportional to the intensity of the electric field. Therefore, the variations of the electric-field intensity, as illustrated in FIGS. 9(1) through 9(5), result in non-uniform thickness of films on the wafers with respect to their positions in the reaction tube. Also, for the same reason, the depth of the plasma etching cannot be uniform with respect to the positions of the wafers.

The present invention intends to improve the uniformity of thickness of the films deposited on the wafers by the plasma CVD process, or of the portions etched away from the wafers by the plasma etching process.

Figure 10A:
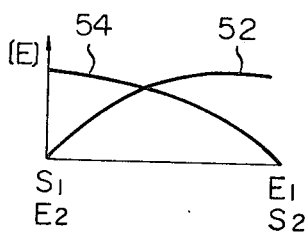
Figure 10B:
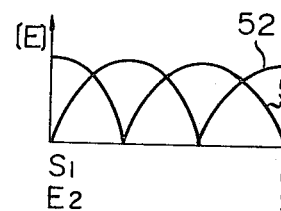
Figure 10C:
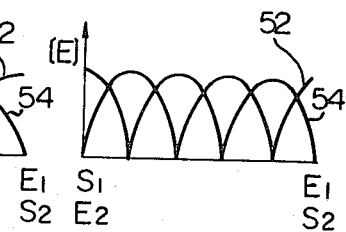

FIG. 10a illustrates two lines showing electric field intensities when the feed points of the power to the bus lines are changed according to the present invention. In FIG. 10a, the curve 52 is the same as the curve of FIG. 9(1). If the feed point $S_1$ and the end point $E_1$ in the reaction tube are exchanged, so that the new feed point $S_2$ corresponds to the original end point $E_1$ and the new end point $E_2$ corresponds to the original feed point $S_1$, the reversed curve 54 will be obtained. According to one embodiment of the invention, the feed point is fixed to the point $S_1$ during the first half period of a plasma CVD process, and then during the last half period of the process, the feed point is fixed to the point $S_2$. By exchanging the feed point as mentioned above, the thickness of the films deposited on the wafers becomes almost uniform regardless of the electrode positions between the feed point $S_1$ and the end point $E_1$. FIG. 10b and FIG. 10c correspond to FIG. 9(3) and FIG. 9(5), respectively. In both of FIGS. 10b and 10c, the curve 54 can be obtained by exchanging the feed points, as in the case of FIG. 10a.

Figure 11:
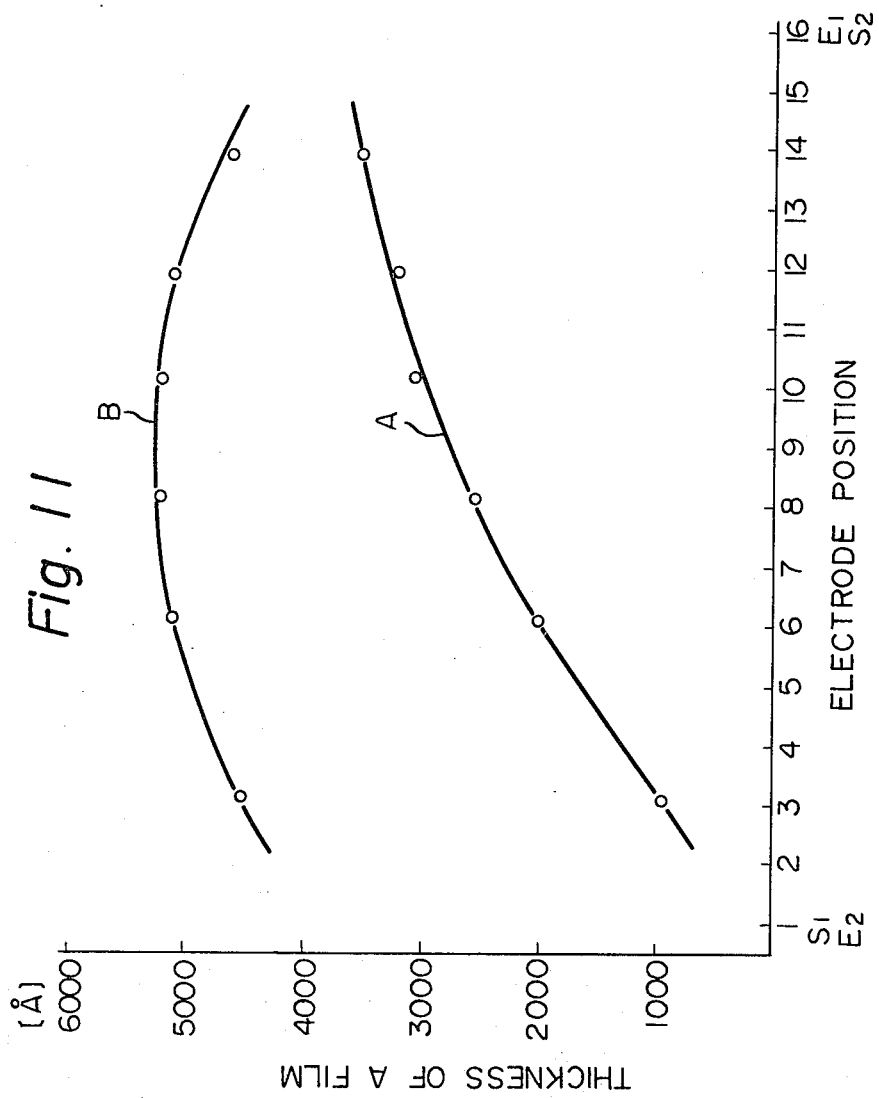
FIG. 11 shows the result of an experiment according to one embodiment of the present invention.

FIG. 11 illustrates the result of an experiment according to one embodiment of the present invention. The experiment was performed under the following conditions:

the diameter of the quartz tube was 140 mm,
the diameter of an electrode plate was 120 mm,
the diameter of each wafer was 4",
the number of electrode plates in a reaction tube was sixteen,
the distance between adjacent electrode plates was 20 mm,
the wafer temperature before producing the plasma was 300° C.,
the pressure of the reaction gas ($NH_3+SiH_4$) was 0.85 Torr,
the high-frequency electrical power fed to the bus lines was 8 W, and
the frequency of the power was 13.56 MHz.

The positions of sixteen electrode plates are numbered from 1 to 16 on the abscissa of FIG. 11. The ordinate of FIG. 11 represents the thickness of a film deposited on a wafer. As previously mentioned, the thickness of a film was nearly proportional to the intensity of the electric field. For the first thirty minutes of the plasma CVD process the feed point was fixed to the left-most electrode 1. Then, after the end of the first thirty minutes, a thickness curve A with respect to the electrode positions was obtained. As can be seen from the curve A, the thickness of the film on the wafer mounted on the electrode plate at position 3 is below 1000 angstroms, while the thickness of the film on the wafer mounted on the electrode plate at position 14 is about 3500 angstroms. The difference in these thicknesses is more than 2500 angstroms. However, after the first thirty minutes, the feed point was changed, according to the present invention, from the left-most electrode 1 to the right-most electrode 16. Then, the plasma CVD process was continued for thirty minutes. After the end of the last thirty minutes, a thickness curve B with respect to the electrode positions was obtained. As can be seen from the curve B, the thickness at the electrode plate in position 3 is nearly equal to that at the electrode plate in position 14 and is about 4500 angstroms. On the curve B, the maximum thickness is about 5250 angstroms at the electrode 10. The difference between the maximum thickness and minimum thickness on the curve B is only 750 angstroms. Therefore, the uniformity of thickness of films with respect to the electrode positions has been greatly improved.

Figure 12:
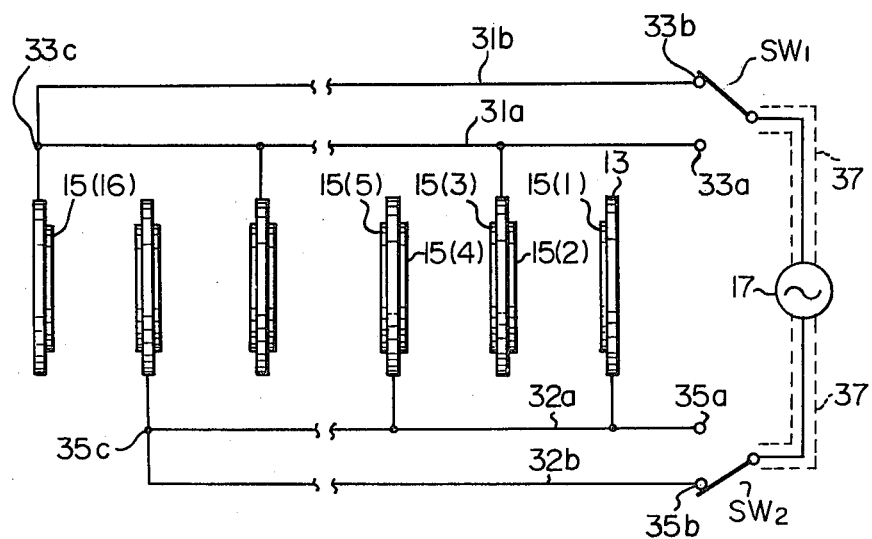
FIG. 12 is a schematic circuit diagram of an electrode structure for explaining the method of applying high-frequency voltage to the electrode plates according to one embodiment of the present invention.

FIG. 12 is a schematic circuit diagram of an electrode structure for explaining the method of applying high-frequency voltage to the electrode plates, according to one embodiment of the present invention. In FIG. 12, one terminal of the high-frequency power supply 17 is connected through a switch $SW_1$ to a right end point 33a of a bus line 31a or a right end point 33b of a bus line 31b, and the other terminal of the power supply 17 is connected through a switch $SW_2$ to a right end point 35a of a bus line 32a or a right end point 35b of a bus line 32b. The bus line 31a is connected to the bus line 31b at the left-most point 33c of the bus line 31a. Also, the bus line 32a is connected to the bus line 32b at the left-most point 35c of the bus line 32a. During the first half period of the plasma CVD processing, the power supply 17 is connected between the end points 33a and 35a. During this half period, the situation of the electrode structure is the same as that of FIG. 2, and thus, after this half period, the film deposited on the right-most wafer 15(1), which is nearest to the feed point 35a, is thinnest, and the film deposited on the left-most wafer 15(16), which is the farthest from the feed point 33a, is thickest. Then, according to the present embodiment, the switches $SW_1$ and $SW_2$ are switched, so that the power supply 17 is connected between the end point 33b of the bus line 31b and the end point 35b of the bus line 32b, and then the last half period of the processing is executed. During this last half period, the feed point from one terminal of the power supply is the point 33c, and the other feed point is 35c. Therefore, after this last half period, substantially uniform thicknesses of films can be obtained.

Although the switches $SW_1$ and $SW_2$ are switched only once during the CVD process in this embodiment, they may be switched more than once as long as the time periods are appropriate.

Figure 13:
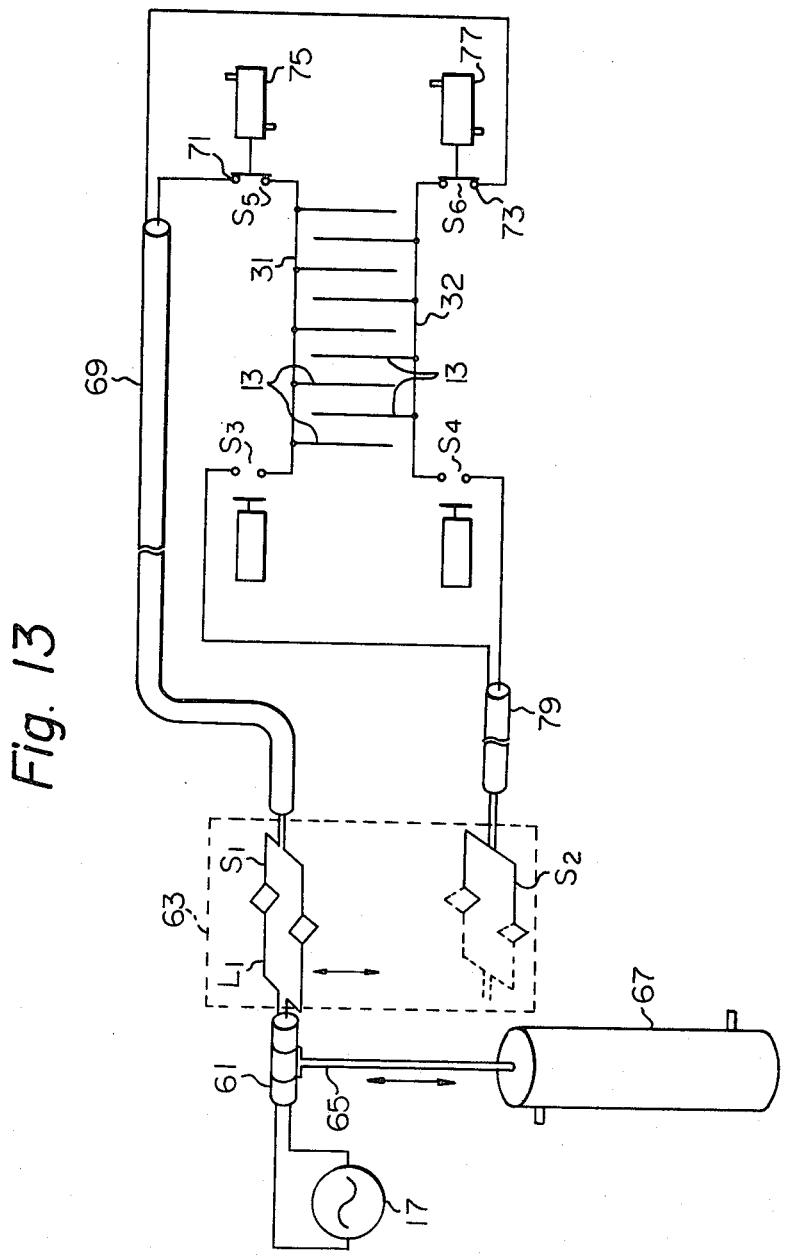
FIG. 13 is a schematic diagram showing a switching mechanism for applying high-frequency power to the electrode structure of FIG. 12.

FIG. 13 is a schematic diagram showing a switching mechanism for applying high-frequency power to the electrode structure of FIG. 12, according to one embodiment of the invention. In FIG. 13, the high-frequency oscillator (power supply) 17 is connected through a coaxial cable 61 to a coupler 63. The coaxial cable 61 is mechanically fixed to a rod 65 which is reciprocally movable by means of an air cylinder 67. By the reciprocal movement of the coaxial cable 61, the inductance $L_1$ in the coupler 63 is coupled to either the inductance $S_1$ or $S_2$. In order to avoid high-frequency interference, the inductances $S_1$ and $S_2$ are spaced apart from each other by more than 3 cm. When the inductance $L_1$ is coupled to the inductance $S_1$, the high-frequency power is applied through a coaxial cable 69 between a terminal 71 in a switch $S_5$ and a terminal 73 in a switch $S_6$. By actuating air cylinders 75 and 77, the switches $S_5$ and $S_6$ are turned on to conduct the power to the right end of a pair of bus lines 31 and 32. In the same way, when the inductance $L_1$ is coupled to the inductance $S_2$, the power is applied through a coaxial cable 79 and switches $S_3$ and $S_4$ to the left end of the pair of bus lines 31 and 32. In order to avoid high-frequency interference, the distance between the terminals in each of the switches $S_3$, $S_4$, $S_5$, and $S_6$ is designed to be more than 3 cm. In order to equalize the inductance characteristic, the length of the coaxial cable 69 may be equal to that of the coaxial cable 79.

Figure 14:
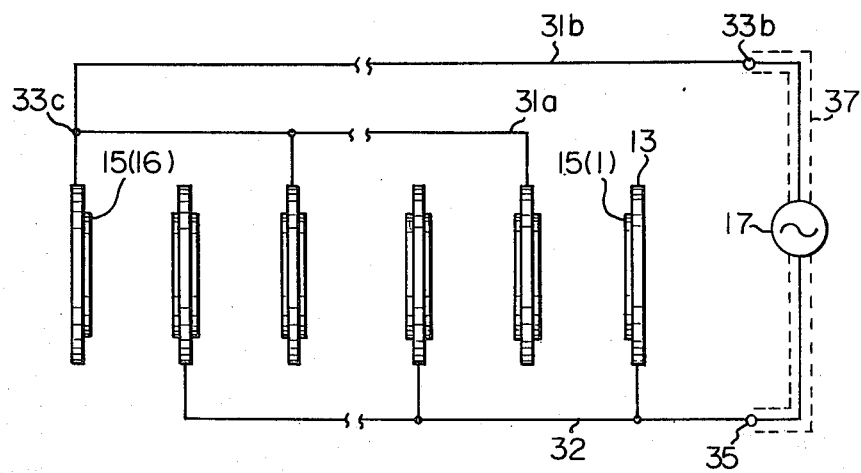
FIG. 14 is another embodiment of a schematic circuit diagram of an electrode structure, according to the present invention.

FIG. 14 is another embodiment of a schematic circuit diagram of an electrode structure, according to the present invention. In FIG. 14, one of the feed points is fixed to the left-most end 33c of a bus line 31b whose right-most end 33b is connected directly, but not through any switch, to the one terminal of the power supply. The other feeding point is fixed to the right-most end 35 of a bus line 32 in the same way as the prior art method. By this construction, the intensity of the electric field can substantially be uniform within the reaction tube. Thus, films of substantially uniform thicknesses are deposited on the wafers.

Although the explanation has been made about the plasma CVD process in the foregoing description of the preferred embodiments, the plasma etching process may also be adaptable to these embodiments.

From the foregoing description of the preferred embodiments, it is apparent that, according to the present invention, uniform thicknesses in a plasma CVD process, as well as uniform depths in a plasma etching process, can be obtained. Therefore, the present invention is effective for mass production of semiconductor devices, such as those used in integrated circuits.

What is claimed is:

1. A method for processing substrate material by plasma treatment in a reaction chamber, comprising the steps of:

mounting said substrate materials onto a series of electrode plates arranged in parallel to each other;

connecting alternate ones of said electrode plates to alternate ones of a pair of bus lines;

applying high-frequency power between said pair of bus lines for producing plasma between said electrode plates; and changing the feed points of said high-frequency power on said pair of bus lines so that said plasma treatment is effected substantially uniformly in the spaces between said electrode plates.

2. The method of claim 1, wherein the feed points of said high-frequency power are alternately changed periodically from one end of said pair of bus lines to the other end of said pair of bus lines.

3. The method of claim 2, wherein said feed points of said high-frequency power are changed at least once during said plasma treatment.

4. The method of claim 2, wherein said feed points of said high-frequency power are changed at the approximate midpoint of the time required for said plasma treatment.

5. The method of claim 1, wherein one of said feed points is initially connected to one end of one of said pair of bus lines and another one of said feed points is initially connected to the other end of another one of said pair of bus lines.

6. The method of claim 1, wherein each of said substrate materials is a semiconductor wafer.

7. The method of claim 1, wherein said plasma treatment comprises chemical vapor deposition of a film material on said substrate materials.

8. The method of claim 7, wherein said film material is a semiconductor material.

9. The method of claim 7, wherein said film material is an insulating material.

10. The method of claim 1, wherein said plasma treatment comprises an etching treatment of said substrate materials.

11. The method of claim 10, wherein said etching treatment comprises etching of a semiconductor wafer.

12. The method of claim 10, wherein said etching treatment comprises etching of an insulating material on said substrate materials.

13. The method of claim 10, wherein said etching treatment comprises etching of a metal layer on said substrate materials.

14. The method of claim 1, wherein said step of changing the feedpoints comprises movement of a first inductive coupling element through which said high frequency power is applied so that said first inductive coupling element is adjacent to either a second or third inductive coupling element respectively, said second and third inductive coupling elements being respectively operatively connected to said feed points.

15. An apparatus for plasma treatment, comprising:
a reaction tube;
a plurality of parallel electrode plates within said reaction tube, said electrode plates being capable of supporting semiconductor wafers;
a plurality of gas-tight valves, connected to the interior of said reaction tube;
first and second bus lines, each connected to alternate ones of said electrode plates;
a first power line, comprising two conductors respectively connected to first feed points respectively on said first bus line and on said second bus line;
a second power line, comprising two conductors respectively connected to second feed points respectively on said first bus line and on said second bus line; and
means for coupling a high-frequency power supply to said first power line or said second power line selectively.

16. The apparatus of claim 15, wherein said means for coupling comprises:
a first inductive coupling element, operatively connected to said high frequency power supply;
a second inductive coupling element, operatively connected to said first power line;
a third inductive coupling element, operatively connected to said second power line; and
means for mechanically translating said first inductive coupling element so that it is adjacent either to said second inductive coupling element or to said third inductive coupling element selectively.

17. The apparatus of claim 16, wherein said means for translating said first inductive coupling element comprises a pneumatic cylinder mechanically connected thereto.

18. The apparatus of claim 16 or 17, further comprising a plurality of switches connected between said ends of said bus lines and said conductors of said power lines respectively.

19. The apparatus of claim 15, further comprising:
a vacuum supply, operatively connected to a first one of said gas-tight valves; and
a plurality of reaction gas supplies, operatively connected to other ones of said gas-tight valves respectively.

20. The device of claim 15, wherein said reaction tube comprises quartz.

* * * * *

UNITED STATES PATENT AND TRADEMARK OFFICE
CERTIFICATE OF CORRECTION

PATENT NO. : 4,292,153

DATED : September 29, 1981

INVENTOR(S) : Kudo et al.

It is certified that error appears in the above—identified patent and that said Letters Patent is hereby corrected as shown below:

```
Front page, [57] Abstract:
          line 6, delete second occurrence of "a";
          line 8, after "plates" insert --and
                  periodically--;
          line 9, after "lines" insert --,--.
Column 2, lines 26, "one" should be --ones--;
          line 54, "5b." should be --5b,--.
Column 4, line 34, "L̄₄" should be --Lₙ--.
Column 5, line 2, "thŕough" should be --, 7(3), and--.
Column 6, line 16, "4," should be --4 inches,--.
Column 7, line 64, "substantially be" should be
                  --be substantially--.
```

Signed and Sealed this

Ninth Day of March 1982

[SEAL]

Attest:

GERALD J. MOSSINGHOFF

*Attesting Officer*     *Commissioner of Patents and Trademarks*